United States Patent
Chang

(10) Patent No.: US 9,633,982 B2
(45) Date of Patent: Apr. 25, 2017

(54) METHOD OF MANUFACTURING SEMICONDUCTOR DEVICE ARRAY

(71) Applicants: Chun-Yen Chang, Hsinchu County (TW); GLOBALWAFERS CO., LTD., Hsinchu (TW)

(72) Inventor: Chun-Yen Chang, Hsinchu County (TW)

(73) Assignees: Chun Yen Chang, Hsinchu County (TW); GLOBALWAFERS CO., LTD., Hsinchu (TW)

( * ) Notice: Subject to any disclaimer, the term of this patent is extended or adjusted under 35 U.S.C. 154(b) by 0 days.

(21) Appl. No.: 14/623,951

(22) Filed: Feb. 17, 2015

(65) Prior Publication Data

US 2016/0240516 A1    Aug. 18, 2016

(51) Int. Cl.
| | |
|---|---|
| H01L 21/00 | (2006.01) |
| H01L 25/075 | (2006.01) |
| H01L 21/306 | (2006.01) |
| H01L 21/683 | (2006.01) |
| H01L 21/78 | (2006.01) |

(Continued)

(52) U.S. Cl.
CPC .... *H01L 25/0753* (2013.01); *H01L 21/30604* (2013.01); *H01L 21/6835* (2013.01);
(Continued)

(58) Field of Classification Search
CPC ........... H01L 2924/00; H01L 21/02422; H01L 21/02628; H01L 29/7869; H01L 21/6835;
(Continued)

(56) References Cited

U.S. PATENT DOCUMENTS

| | | | | | |
|---|---|---|---|---|---|
| 4,339,870 | A | * | 7/1982 | Ball | ..................... H01L 21/6835 257/623 |
| 4,353,779 | A | * | 10/1982 | Przybysz | .......... H01L 21/30612 252/79.3 |

(Continued)

OTHER PUBLICATIONS

Takayoshi Oshima et al, Wet Etching of β-Ga2O3 Substrates, Japanese Journal of Applied Physics 48 (2009) 040208.

(Continued)

*Primary Examiner* — Tod T Van Roy
*Assistant Examiner* — Vu A Vu
(74) *Attorney, Agent, or Firm* — WPAT, P.C., Intellectual Property Attorneys; Anthony King

(57) ABSTRACT

Present disclosure provides a method for manufacturing a semiconductor device array, including (1) providing a temporary substrate; (2) forming a plurality of discrete semiconductor structures over the temporary substrate; and (3) removing a surface portion of the temporary substrate to expose a peripheral bottom surface of the discrete semiconductor structure. Present disclosure also provides a method for transferring discrete semiconductor device, including (1) detaching discrete semiconductor structures of a first type from a first temporary substrate supporting the discrete semiconductor structures of the first type by a transfer stamp; (2) carrying the discrete semiconductor structures over a target substrate by the transfer stamp; and (3) dismounting the discrete semiconductor structures of the first type from the transfer stamp to predetermined sites on the target substrate. The transfer stamp includes a plurality of protrusions, positions of the plurality of protrusions being programmable to match the predetermined sites on the target substrate.

21 Claims, 17 Drawing Sheets

(51) Int. Cl.
*H01L 23/544* (2006.01)
*H01L 33/00* (2010.01)

(52) U.S. Cl.
CPC ............ *H01L 21/78* (2013.01); *H01L 23/544* (2013.01); *H01L 33/0079* (2013.01); *H01L 33/0095* (2013.01); *H01L 2221/68354* (2013.01); *H01L 2221/68368* (2013.01); *H01L 2223/5442* (2013.01); *H01L 2223/54426* (2013.01); *H01L 2223/54486* (2013.01)

(58) Field of Classification Search
CPC ......... H01L 24/95; H01L 24/83; H01L 25/50; H01L 27/1292; H01L 29/1606; H01L 33/0079; H01L 33/0095; H01L 33/507; H01L 2221/68354
USPC .......................................................... 438/28
See application file for complete search history.

(56) References Cited

U.S. PATENT DOCUMENTS

| | | | | |
|---|---|---|---|---|
| 5,828,076 A * | 10/1998 | Gossner | ................. | B82Y 10/00 257/14 |
| 8,198,148 B2 * | 6/2012 | Koo | ................. | H01L 21/6835 257/623 |
| 8,334,152 B2 * | 12/2012 | Speier | ................ | H01L 33/0079 257/E21.06 |
| 2010/0214012 A1 * | 8/2010 | Raza | .................... | B82Y 10/00 327/537 |
| 2011/0037088 A1 * | 2/2011 | Oya | ....................... | H01L 33/40 257/94 |
| 2012/0064664 A1 * | 3/2012 | Yamazaki | ........... | H01L 29/7869 438/104 |
| 2012/0299147 A1 * | 11/2012 | Mitani | ................ | H01L 21/2007 257/506 |
| 2013/0056749 A1 * | 3/2013 | Tischler | ............. | H01L 21/6835 257/76 |
| 2013/0309792 A1 * | 11/2013 | Tischler | ............. | H01L 33/0079 438/28 |

OTHER PUBLICATIONS

Tsung-Yen Tsai et al., GaN Epilayer Grown on Ga2O3 Sacrificial Layer for Chemical Lift-Off Application, Electrochemical and Solid-State Letters, 14 (11) H434-H437 (2011).

* cited by examiner

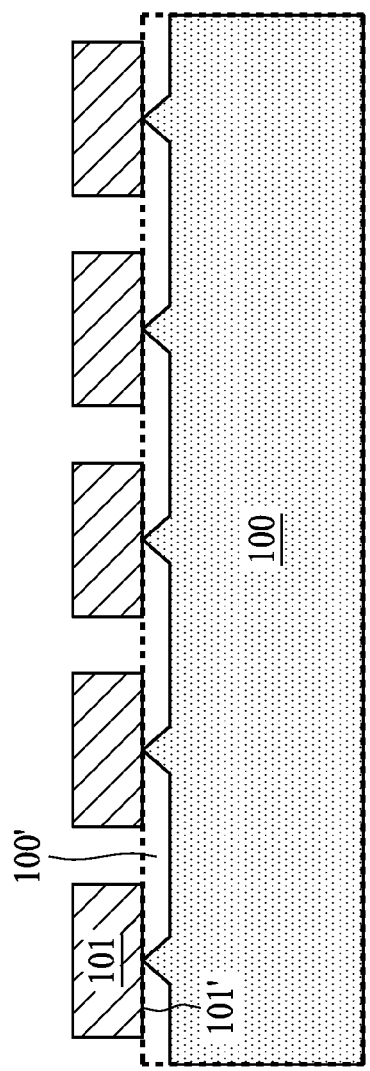
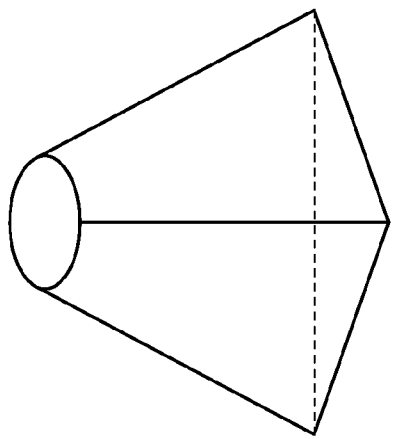
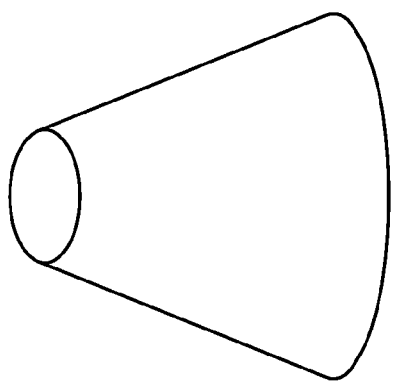
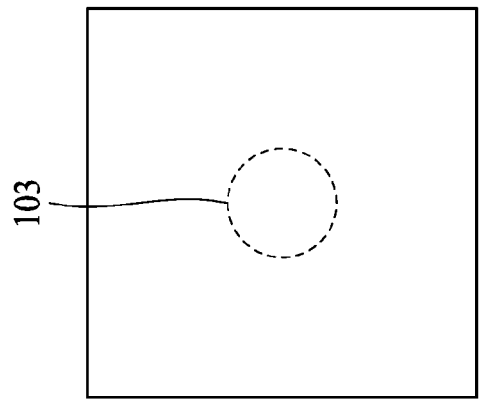

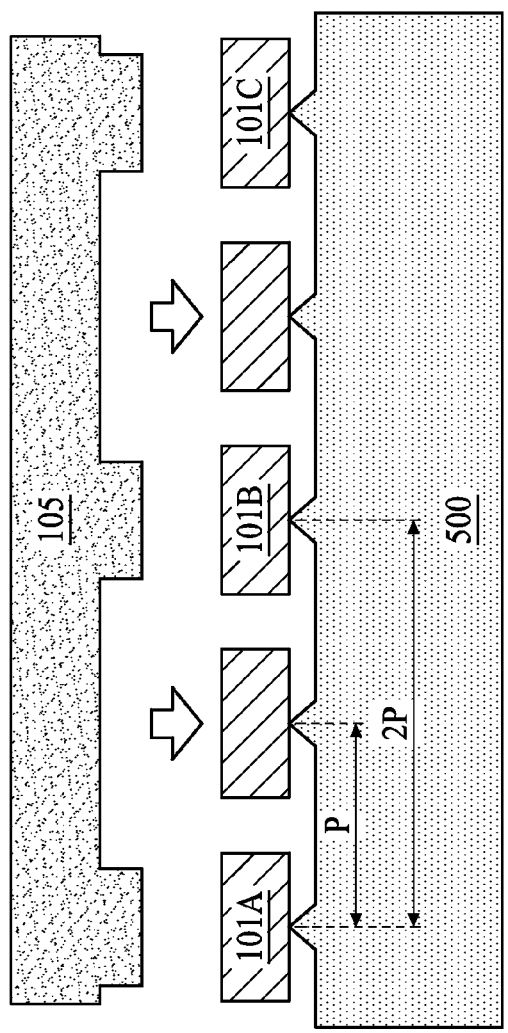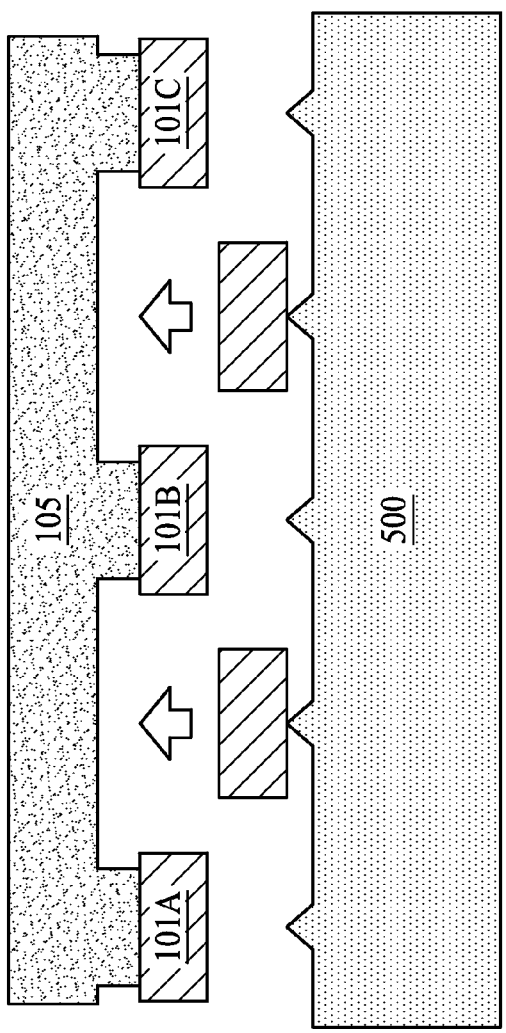

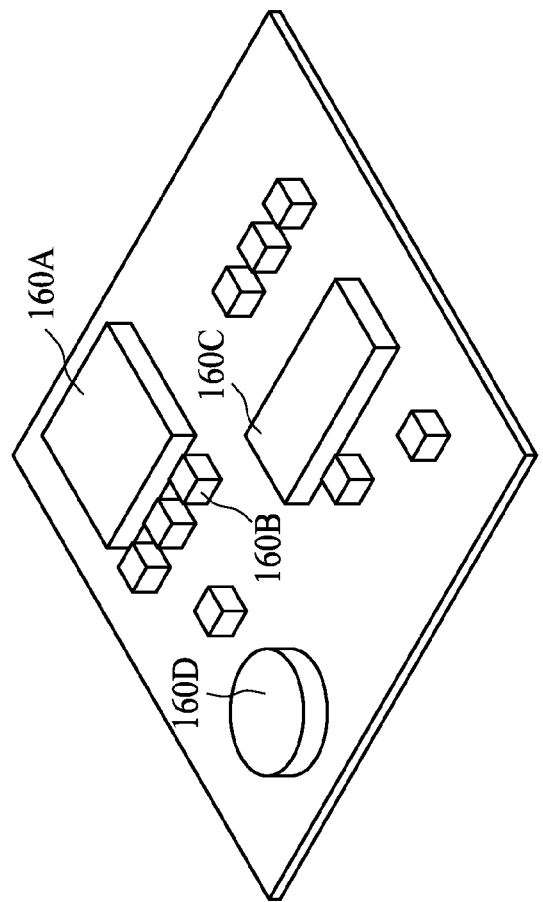
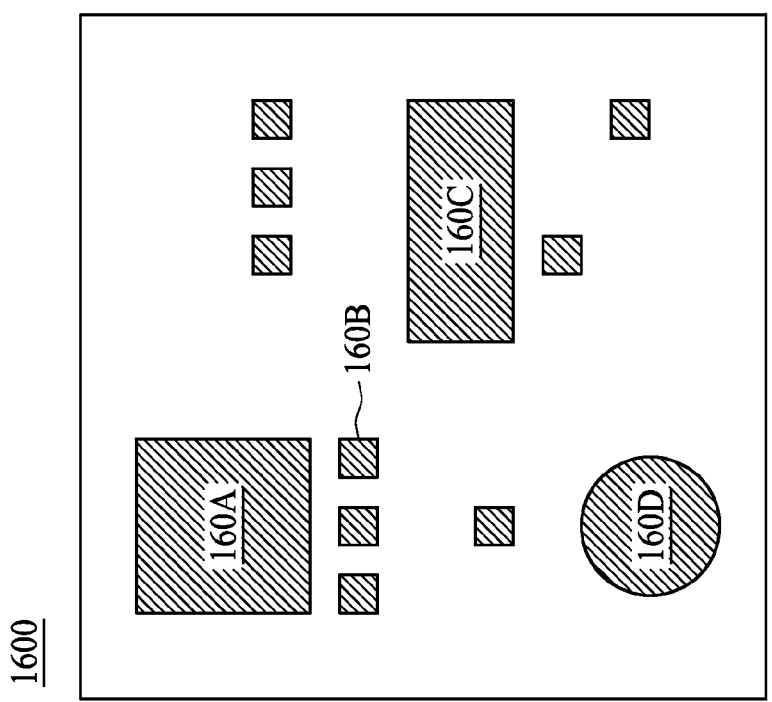
FIG. 13B
FIG. 13A

METHOD OF MANUFACTURING SEMICONDUCTOR DEVICE ARRAY

BACKGROUND

Integration and packaging issues are of the main obstacles for the commercialization of micro devices such as radio frequency (RF) microelectromechanical systems (MEMS) micro switches, light-emitting diode (LED) display systems, and MEMS or quartz-based oscillators.

Traditional technologies for transferring of devices include transfer by wafer bonding from a transfer wafer to a receiving wafer. One such implementation is "direct printing" involving one bonding step of an array of devices from a transfer wafer to a receiving wafer, followed by removal of the transfer wafer. Another such implementation is "transfer printing" involving two bonding/de-bonding steps. In transfer printing a transfer wafer may pick up an array of devices from a donor wafer, and then bond the array of devices to a receiving wafer, followed by removal of the transfer wafer.

Some printing process variations have been developed where a device can be selectively bonded and de-bonded during the transfer process. In both traditional and variations of the direct printing and transfer printing technologies, the transfer wafer is de-bonded from a device after bonding the device to the receiving wafer. In addition, the entire transfer wafer with the array of devices is involved in the transfer process.

Conventionally, a method for fabricating a semiconductor die array includes the steps of: (1) growing at a growth temperature within a growth reactor a first semiconductor layer on a foreign growth substrate or a donor substrate; (2) growing at the growth temperature within the growth reactor a second semiconductor layer on the first semiconductor layer; (3) separating by laser lift-off the first semiconductor layer from the growth substrate or the donor substrate so as to form a free-standing semiconductor die; and (4) transferring the free-standing semiconductor die from the donor substrate to a target substrate so as to form an array of the semiconductor die by the direct printing or the transfer printing operation.

The separation of the semiconductor die and the growth substrate can be accomplished in various manners including mechanical grinding, laser lift-off, etching, etc. However, this conventional approach has several limitations. For example, III-nitride deposition process necessitates high temperatures (typically 1000 degrees Celsius to 1100 degrees Celsius). During cooling down from the growth temperature to room temperature, the III-nitride film undergoes a biaxial stress caused by the large difference between the thermal-expansion coefficients of the nitride crystal and the substrate material. This stress can cause cracking, bowing, generation of crystal defects, and other adverse effects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1, FIG. 2, FIG. 3A, FIG. 4A, FIG. 4B, FIG. 5A, FIG. 6 show fragmental cross sectional views of a method for manufacturing a semiconductor device array, in accordance with some embodiments of the present disclosure.

FIG. 3B shows a top view of a discrete die formed over a temporary substrate, in accordance with some embodiments of the present disclosure.

FIG. 3C and FIG. 3D show perspective views of a point contact of the temporary substrate, in accordance with some embodiments of the present disclosure.

FIG. 13A shows a bottom view of a programmed transfer stamp, in accordance with some embodiments of the present disclosure.

FIG. 13B shows a perspective view of the programmed transfer stamp of FIG. 13A.

DETAILED DESCRIPTION

Figure 1:
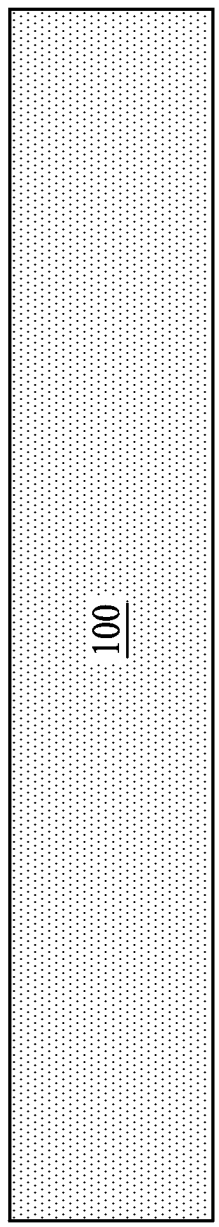

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Various example embodiments will now be described more fully with reference to the accompanying drawings in which exemplary embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the exemplary embodiments.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, the exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from an implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the exemplary embodiments.

Unless otherwise defined, all terms (including technical and scientific terms) used herein have the same meaning as commonly understood by one of ordinary skill in the art to which the exemplary embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

The direct printing or the transfer printing operation discussed above involves bonding/picking up an array of devices (semiconductor die) by a transfer wafer from a temporary wafer to a target wafer, followed by removal of the transfer wafer. However, said transferring means can only transfer a batch, or a fixed array of devices. For a semiconductor device array designed to accommodate a mixture types of semiconductor devices such as optoelectronic devices (LED, photovoltaic, photodetector, VCSEL, etc.) and microelectronic devices (complementary metal-oxide-silicon transistor, heterostructure field effect transistor, electron sensor, etc.), the above discussed transferring operation is somehow limited because lack of operational freedom in picking and placing a particular set of devices in a predetermined positional pattern. Removing the discrete semiconductor die from a temporary substrate and transferring the same to a target substrate can be done by laser lift-off and chemical lift-off. It is also known that residues cleaning become an issue after the above lift-off operations.

Present disclosure provides a method for manufacturing a semiconductor device array. The method includes (1) providing a temporary substrate; (2) forming a plurality of discrete semiconductor structures over the temporary substrate; and (3) removing a surface portion of the temporary substrate to expose a peripheral bottom surface of the discrete semiconductor structure. The aforesaid operation (3) provides a separation means different from the conventional lift-off means. A surface portion of the temporary substrate is chemically removed so as to expose a major bottom portion of the discrete semiconductor structure. Only a point contact is remained between the discrete semiconductor structure and the temporary substrate after the removal of the surface portion of the temporary substrate, in order to facilitate subsequent mechanical transfer operation with respect to a predetermined set of discrete semiconductor structures (semiconductor dies).

Present disclosure also provides a method for transferring discrete semiconductor device, including (1) detaching discrete semiconductor structures of a first type from a first temporary substrate supporting the discrete semiconductor structures of the first type by a transfer stamp; (2) carrying the discrete semiconductor structures over a target substrate by the transfer stamp; and (3) dismounting the discrete semiconductor structures of the first type from the transfer stamp to predetermined sites on the target substrate. The transfer stamp includes a plurality of protrusions. Positions of the plurality of protrusions are programmable to match the predetermined sites on the target substrate.

Referring to FIGS. 1, 2, 3A, 4A, 4B, 5A, and 6. The aforesaid figures show fragmental cross sectional views of a method for manufacturing a semiconductor device array, in accordance with some embodiments of the present disclosure. In FIG. 1, a temporary substrate 100 is provided. In some embodiments, the temporary substrate 100 can be virtually any substrate that is suitable for the desired semiconductor structure disposed or grown thereon. The temporary substrate 100 may include non-crystalline materials or organic materials. In some embodiments, the temporary substrate 100 can be an elementary semiconductor including silicon or germanium in crystal, polycrystalline, or an amorphous structure; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or combinations thereof. The temporary substrate 100 can also includes the alloy semiconductor substrate having a gradient SiGe feature in which the Si and Ge composition change from one ratio at one location to another ratio at another location of the gradient SiGe feature. The temporary substrate 100 can also include a strained SiGe formed over a silicon substrate. Furthermore, the temporary substrate 100 can be a semiconductor on insulator, such as silicon-on-insulator (SOI)).

In some embodiments, the temporary substrate 100 is used for III-nitride based semiconductor structure. For example, the temporary substrate 100 can be sapphire substrate or SiC substrate. For another example, the temporary substrate 100 can be, but is not limited to, a heat dissipation substrate having higher thermal conductivity than a sapphire substrate, and can be a substrate less expensive than a single crystalline SiC substrate. Still another example, the temporary substrate 100 may be an amorphous or a crystalline AlN substrate. However, other substrates aside from the AlN substrate, e.g., a Si substrate, a Ge substrate, an amorphous SiC substrate, a gallium oxide substrate, and a ceramic substrate, or an organic substrate may be used as the temporary substrate 100.

Figure 2:
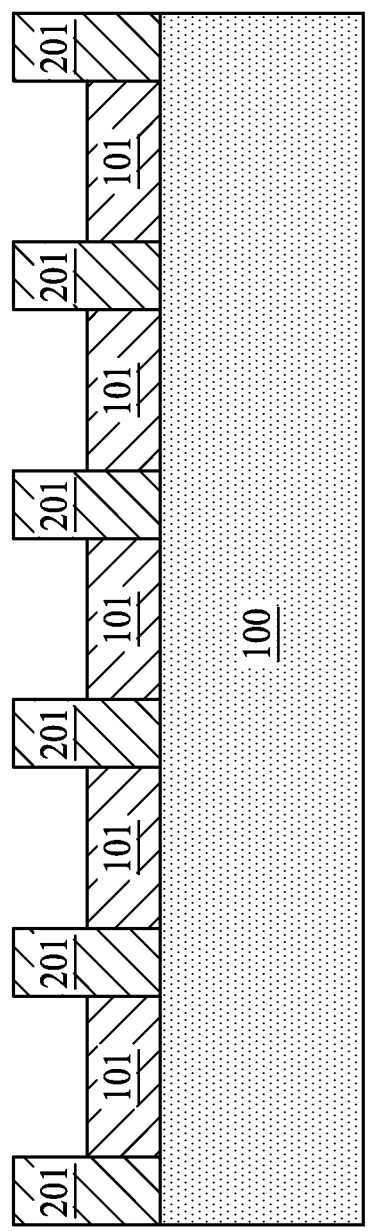

Referring to FIG. 2, several discrete semiconductor structures 101 are formed over the temporary substrate 100. The discrete semiconductor structures 101 herein refer to semiconductor structures that are configured to being mechanically manipulated individually in subsequent operations. As shown in FIG. 2, masking areas 201 such as photoresist are disposed between adjacent discrete semiconductor structures 101. The discrete semiconductor structures 101 can be organic, inorganic, crystalline, amorphous, or polycrystalline devices. In some embodiments, the discrete semiconductor structures 101 can be a crystalline light emitting diode (LED), an amorphous LED, a polycrystalline LED, an organic LED (OLED) including a small molecule OLED or a polymer-based OLED, an organic FET (OFET) including a small molecule OFET or a polymer-based OFET, a photodetector, a laser structure, a photovoltaic (PV), an organic photovoltaic, a microelectronic chip, a communication chip, a low-temperature polysilicon TFT LCD derive, or combinations thereof. In some embodiments, the discrete semiconductor structures 101 may not all be identical structures.

A mixture of optoelectronic structures and microelectronic structure can be formed over the temporary substrate 100 in different growing operations. For example, some of the discrete semiconductor structure 101 can be PVs, some can be LEDs, some can be high electron mobility transistor (HEMT), and some can be heterostructure field effect transistor (HFET), all over a same temporary substrate 101. In some embodiments, the masking areas 201 may not be equally spaced as shown in FIG. 2. The masking areas 201 can be designed to fit the scale and size of predetermined semiconductor dies, and forming/removing multiple different patterned masking areas can be done in some embodiments.

Referring to FIG. 3A, a surface portion 100' of the temporary substrate 100 is removed to expose a peripheral bottom surface 101' of the discrete semiconductor structure 101. The dotted lines shown in FIG. 3A delineate an original cross sectional contour of the temporary substrate 100 prior to the removal operation. In some embodiments, the removal operation includes an etching operation using chemical etching agents such as acidic solution, basic solution, organic solution, or the combinations thereof. Etchant demonstrating a high selectivity between the discrete semiconductor structure 101 and the temporary substrate 100 are suitable for the present removal operation. For example, in some embodiments, the temporary substrate 100 is a GaAs substrate, and the discrete semiconductor structures 101 thereon are red LED structures. A mixture selected from H2SO4, H2O2, NH4OH, CH3OH, Br2 may be used as etchant to remove the surface portion 100' of the temporary substrate 100. For another example, in some embodiments, the temporary substrate 100 is a Si substrate, and the discrete semiconductor structures 101 thereon are PV and MOS structures. A mixture selected from HF, HNO3, KOH, may be used as etchant to remove the surface portion 100' of the temporary substrate 100. Still another example, in some embodiments, the temporary substrate 100 is an organic substrate such as a Polyethylene terephthalate (PET) substrate, and the discrete semiconductor structures 101 thereon are organic LED structures. A mixture selected from NaOH and dimethylformamide (DMF) may be used as etchant to remove the surface portion 100' of the temporary substrate 100.

Still referring to FIG. 3A, in some embodiments, the temporary substrate 100 is a β-Ga2O3 substrate, and the discrete semiconductor structures 101 thereon are blue and green LED structures. In some embodiments, 49 wt % of HF can be used to as etchant to remove the surface portion 100' of the temporary substrate 100 under room temperature. In some embodiments, 85 wt % of H3PO4 can be used to as etchant to remove the surface portion 100' of the temporary substrate 100 at about 150 degrees Celsius. In some embodiments, 97 wt % of H2SO4 can be used to as etchant to remove the surface portion 100' of the temporary substrate 100 at about 190 degrees Celsius. However, multiple type of etchant such as a mixture selected from HF, H2SO4, H3PO4, may be used as etchant to remove the surface portion 100' of the temporary substrate 100 at a predetermined weight percent ratio and temperature.

Referring to FIG. 3A and FIG. 3B, FIG. 3B is a top view of the semiconductor structure 101 shown in FIG. 3A. The dotted circle 103 in FIG. 3B illustrates a point contact underlying the semiconductor structure 101. The area outside of the dotted circle 103 can be referred to a peripheral portion of the semiconductor structure 101 because the position of the peripheral portion is more distant to a center of the semiconductor structure 101 compared to that of the point contact. The point contact is a surface portion of the temporary substrate 100 connecting to the semiconductor structure 101 after the removal operation previously discussed. Depending on different etching agents and etching conditions used, the shape of the point contact can be controlled. For example, as shown in FIG. 3C and FIG. 3D, in some embodiments, the point contact can be a cone shape (FIG. 3C) or a multifaceted pyramid shape (FIG. 3D). The multifaceted pyramid shape can occur in crystalline temporary substrates 100 whereas the cone shape is often seen in non-crystalline or organic temporary substrates 100. For example, the faceted point contact on a β-Ga2O3 substrate includes (001) plane that has a lowest etch rate when applying HF solution as etching agents. In FIG. 3A, the surface portion 100' being etched shows a flat bottom. However, FIG. 3A is a simplified illustration for clarity. In some embodiments, the bottom of the surface portion 100' can have a convex, concave, or zigzag morphologies, according to various etching conditions.

Referring to FIG. 4A and FIG. 4B, some of the discrete semiconductor structures 101A, 101B, and 101C are detached from the temporary substrate 100 by a transfer means such as a transfer stamp 105. As can be seen in FIG. 4A, the transfer stamp 105 includes several protrusions placed according to the positions of the semiconductor structures 101A, 101B, and 101C. In some embodiments, the protrusions on the transfer stamp 105 have a pitch 2P, and adjacent semiconductor structures have a pitch P. However, the above integral multiple relations between the pitch of the protrusions and the semiconductor structures are only exemplifying embodiments that shows semiconductor structures arranged in an ordered, or equally spaced, pattern. In other embodiments, neither the protrusions nor the semiconductor structures are ordered, or equally spaced. As such, a pitch cannot be defined in the non-equally spaced protrusions or semiconductor structures collection. Nevertheless, each protrusion still corresponds to the position of at least one semiconductor structure. In some embodiments, several protrusions are corresponding to a single large semiconductor structure.

Still referring to FIG. 4A, the transfer stamp 105 is descended until the protrusions contact several of the semiconductor structures 101A, 101B, and 101C. In some embodiments, the transfer stamp is made of elastomeric materials such as Polydimethylsiloxane (PDMS). The elastomeric materials creates conformal contact with the top surface of the semiconductor structures 101A, 101B, and 101C, generating adhesion forces dominated by, for example, van der Waals interactions. Van der Waals interactions may occur on all types of surfaces, including metallic surfaces and non-metallic surfaces. Subsequently in FIG. 4B, the transfer stamp 105 is elevated so as to apply a shear force separating the connection between the point contact and the semiconductor structures 101A, 101B, and 101C. As shown in FIG. 4A, several of the semiconductor structures 101A, 101B, 101C are picked up and parallel transferred to a target substrate 200 (please refer to FIG. 5A as will be discussed later) synchronically.

Figure 5A:
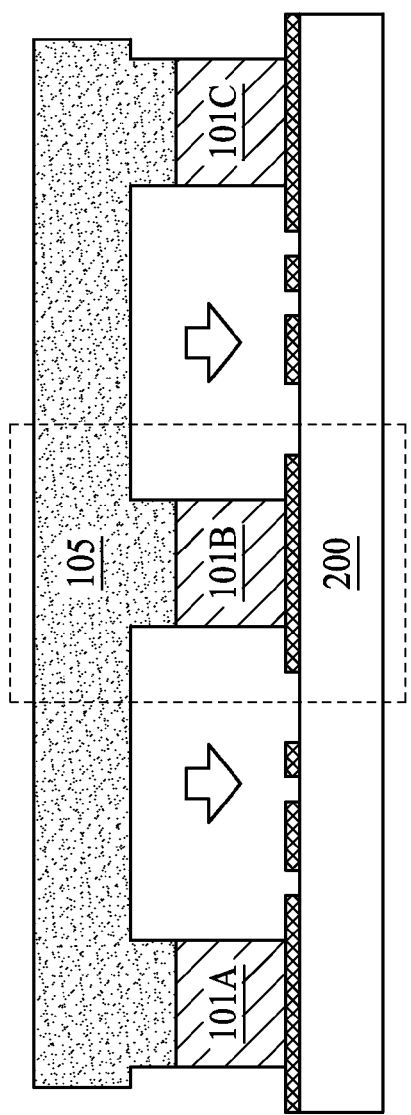
Figure 5B:
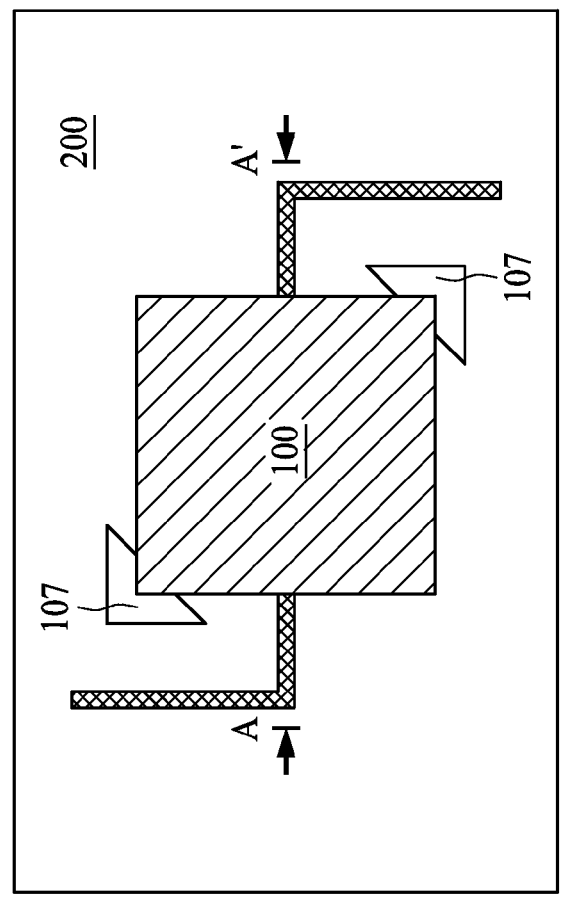
FIG. 5B shows a top view of a discrete die, the alignment mark, and the conductive metal lines, in accordance with some embodiments of the present disclosure.
Figure 6:
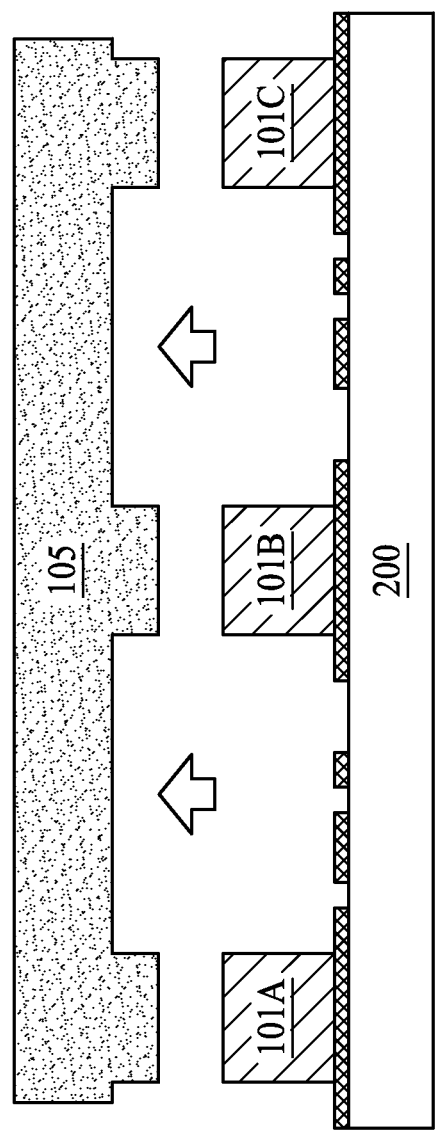

Referring to FIG. 5A and FIG. 6, several of the semiconductor structures 101A, 101B, and 101C are placed on predetermined positions of the target substrate 200 by descending the transfer stamp 105 toward the target substrate 200, and the transfer stamp 105 is elevated to release the semiconductor structures 101A, 101B, and 101C. In some embodiments, the predetermined positions on the target substrate 200 discussed herein refer to locations on the target substrate 200 configured to receive the semiconductor structures 101A, 101B, and 101C. For example, metal layers 105 are pre-patterned on the target substrate 200 which provides electrical contact and communication between different semiconductor structures, according to specific circuit design. FIG. 5A is a top view of the semiconductor structure 101B, a portion of metal layers 105, and the target substrate 200 boxed in FIG. 5A. Alternatively stated, the dotted box in FIG. 5A is a cross sectional view of FIG. 5B dissecting along line AA'. In FIG. 5B, the metal layers 104 have a left metal line 105A and a right metal line 105B connecting the semiconductor structure 101B with other device units (not shown for clarity). In some embodiments, an alignment mark 107 can be optionally provided on the target substrate 200 at the locations avoiding the metal lines. As shown in FIG. 5B, the alignment mark forms a right angle feature at a upper left and lower right corner of the semiconductor structure 101B. People having ordinary skill in the art shall understand the alignment mark 107 shown in FIG. 5B is only exemplifying embodiments, other alignment marks that facilitate the disposition of the transferred semiconductor structures are suitable to be used in the present disclosure.

Figure 7B:
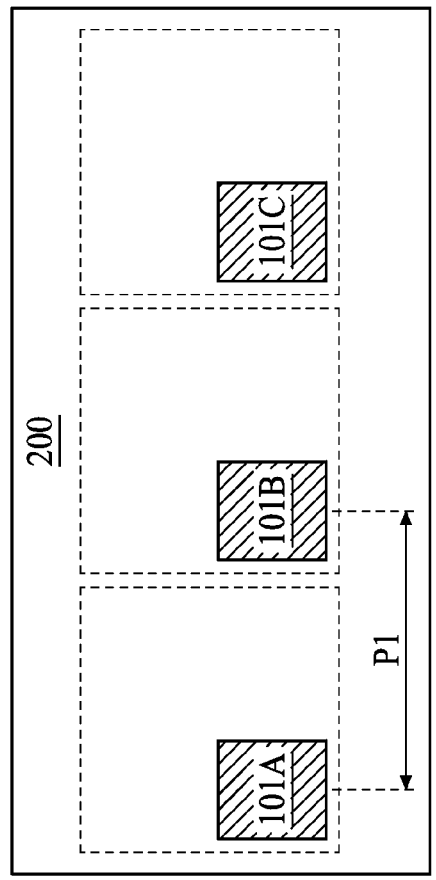
FIG. 7B shows a top view of a portion of a semiconductor device array, in accordance with some embodiments of the present disclosure.
Figure 7A:
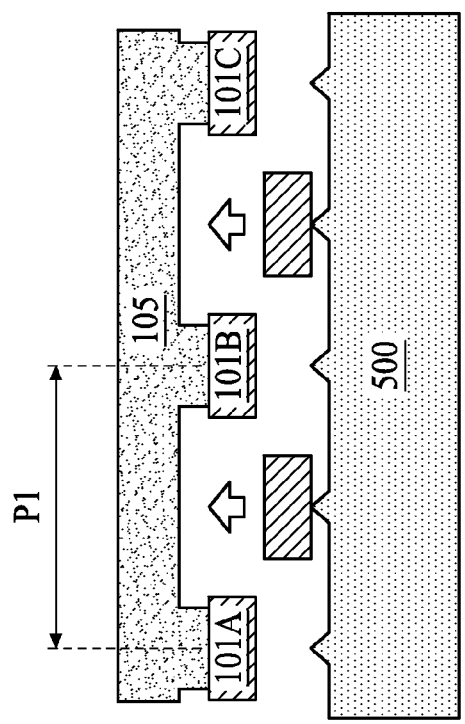
FIG. 7A shows a cross sectional view of a transfer stamp transferring some of discrete dies from a temporary substrate, in accordance with some embodiments of the present disclosure.

FIG. 7A to FIG. 9B shows cross sectional views of multiple semiconductor structures transfer operation. In FIG. 7A, the transfer stamp 105 having a protrusion with a pitch P1 picks up several of the semiconductor structures 101A, 101B, 101C of a first kind from the temporary substrate 100. In some embodiments, the semiconductor structures 101A, 101B, 101C of the first kind are blue LED structures, and the temporary substrate 100 is β-Ga2O3. For instance, the blue LED structures includes a low temperature n-type GaN buffer layer doped with silicon, a high temperature n-type GaN layer, a In0.12GaN/In0.03GaN multiple quantum well (MQW) structures, and a p-type GaN layer doped with magnesium. FIG. 7B shows a top view of the semiconductor structures over the target substrate. The semiconductor structures 101A, 101B, 101C are disposed equally spaced with respect to the pitch P1 of the protrusions on the transfer stamp 105. In some embodiments, the dotted boxes in FIG. 7B defines a pixel of an LED array. Each pixel of the LED array includes identical arrangement of different color LEDs as will be discussed in the subsequent figures.

Figure 8B:
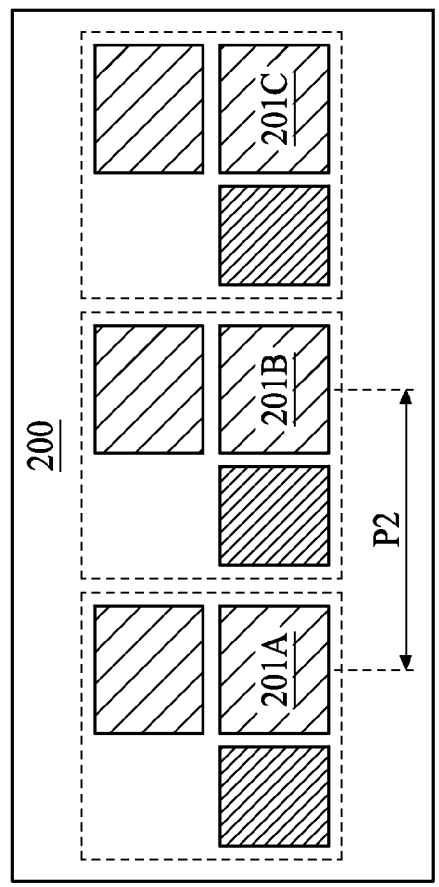
FIG. 8B shows a top view of a portion of a semiconductor device array, in accordance with some embodiments of the present disclosure.
Figure 8A:
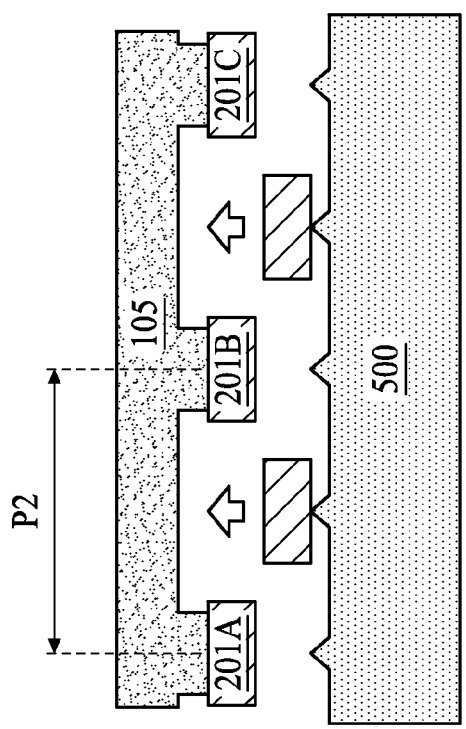
FIG. 8A shows a cross sectional view of a transfer stamp transferring some of discrete dies from a temporary substrate, in accordance with some embodiments of the present disclosure.

In FIG. 8A, the transfer stamp 105 having a protrusion with a pitch P2 picks up several of the semiconductor structures 201A, 201B, 201C of a second kind from the temporary substrate 300. The pitch P2 may or may not be identical to the pitch P1 that separates the semiconductor structures of the first kind. In some embodiments, the semiconductor structures 201A, 201B, 201C of the second kind are green LED structures, and the temporary substrate 300 is β-Ga2O3. For instance, the green LED structures includes a low temperature n-type GaN buffer layer doped with silicon, a high temperature n-type GaN layer, a InGaN/GaN multiple quantum well (MQW) structures, and a p-type AlGaN electronic barrier layer, a p-type GaN layer, and an InGaN current tunneling layer. FIG. 8B shows a top view of the semiconductor structures over the target substrate. The semiconductor structures 201A, 201B, 201C are disposed equally spaced with respect to the pitch P2 of the protrusions on the transfer stamp 105.

Figure 9B:
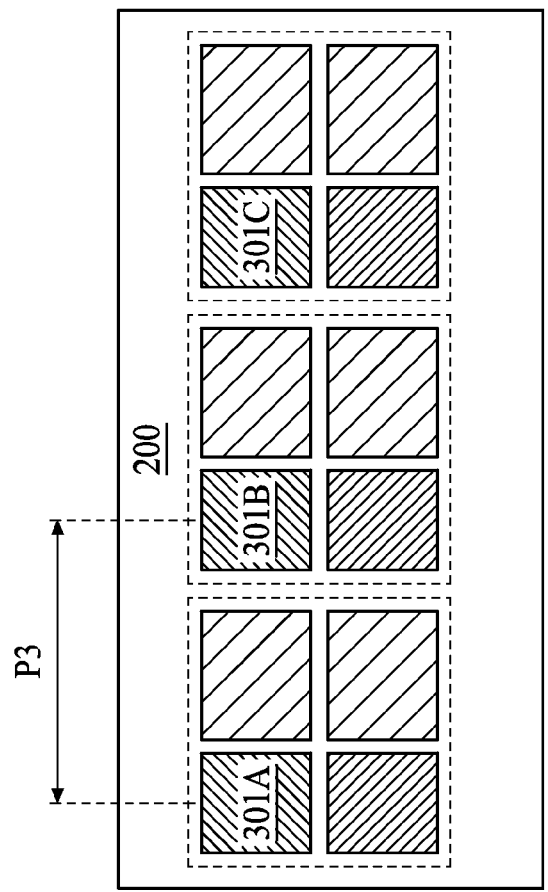
FIG. 9B shows a top view of a portion of a semiconductor device array, in accordance with some embodiments of the present disclosure.
Figure 9A:
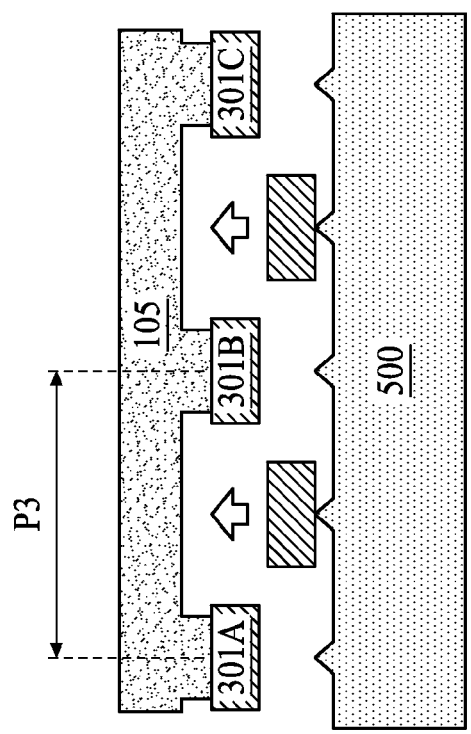
FIG. 9A shows a cross sectional view of a transfer stamp transferring some of discrete dies from a temporary substrate, in accordance with some embodiments of the present disclosure.

In FIG. 9A, the transfer stamp 105 having a protrusion with a pitch P3 picks up several of the semiconductor structures 301A, 301B, 301C of a third kind from the temporary substrate 500. The pitch P3 may or may not be identical to the pitch P1 and pitch P2 that separate the semiconductor structures of the first kind and the second kind, respectively. In some embodiments, the semiconductor structures 301A, 301B, 301C of the third kind is red LED structures, and the temporary substrate 500 is GaAs. For instance, the red LED structures includes a p-type AlGaN buffer layer doped with carbon, Al0.35Ga0.65As/GaAs0.885P0.115 MQW structures, and an n-type Al0.25Ga0.75As layer doped with silicon. FIG. 9B shows a top view of the semiconductor structures over the target substrate. The semiconductor structures 301A, 301B, 301C are disposed equally spaced with respect to the pitch P3 of the protrusions on the transfer stamp 105.

Notwithstanding the embodiments shown in FIG. 7A to FIG. 9B, the semiconductor structures being transferred from a temporary substrate to a target substrate can be various kinds of devices or chips in different categories or sizes. For example, in some embodiments, the semiconductor structure of the first type may be optoelectronic devices such as LED, photovoltaic, photodetector, VCSEL, or the like, and the semiconductor structure of the second type may be a microelectronic devices such as MOSFET, HEMT, electron sensor, or the like. In other embodiments, the transfer stamp may have protrusions positioned at arbitrary locations instead of ordered arrangement with a defined pitch. As discussed in the following disclosure, as shown in FIG. 12A to FIG. 16B, the locations of the protrusions on the transfer stamp are programmable, that is, a pre-designed protrusion mold or an instantaneous modulation of the positions of the protrusions are encompassed in the contemplated scope of the present disclosure.

Figure 10:
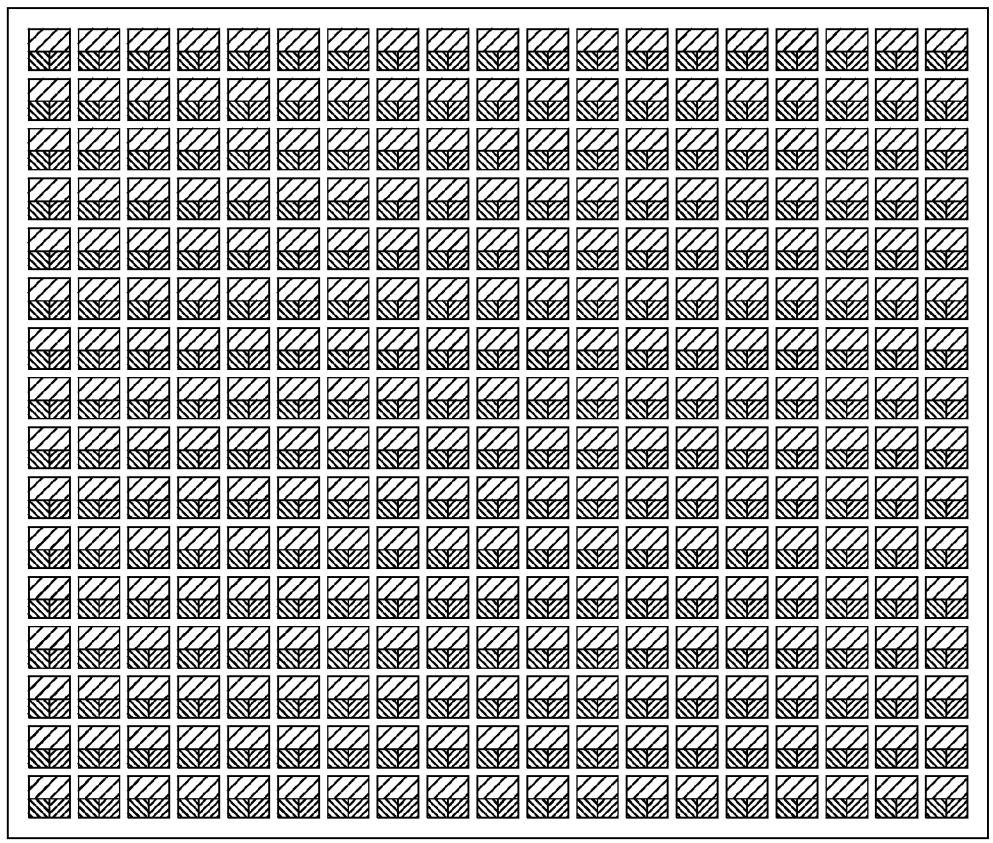
FIG. 10 shows a top view of an LED device array, in accordance with some embodiments of the present disclosure.

As shown in FIG. 10, a RGGB LED array is manufactured by the method discussed previously in the present disclosure. The semiconductor structures can be parallel transferred by a suitable transfer means that is configured to apply adhesion on all types of surfaces and properly release the object at predetermined positions. To facilitate the separation of the semiconductor structures from the temporary substrate, special etching technique is required to retain each semiconductor structure at their original position after the etching operation but being easily picked up by mechanical shear force exerted by the transfer means. In some embodiments, the LED arrays can be used as back light source for all sizes of displays.

Figure 11A:
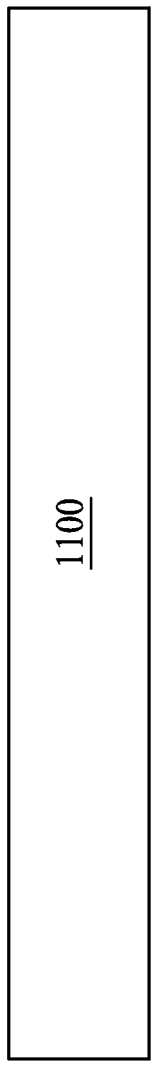
FIG. 11A to FIG. 11F show cross sectional views of a method for manufacturing a transfer stamp, in accordance with some embodiments of the present disclosure.
Figure 11B:
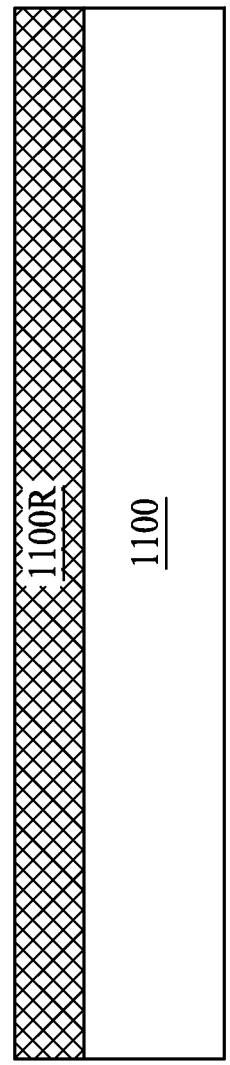
Figure 11C:
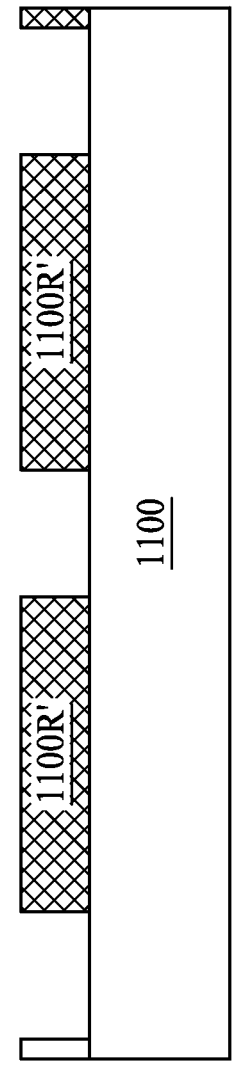
Figure 11D:
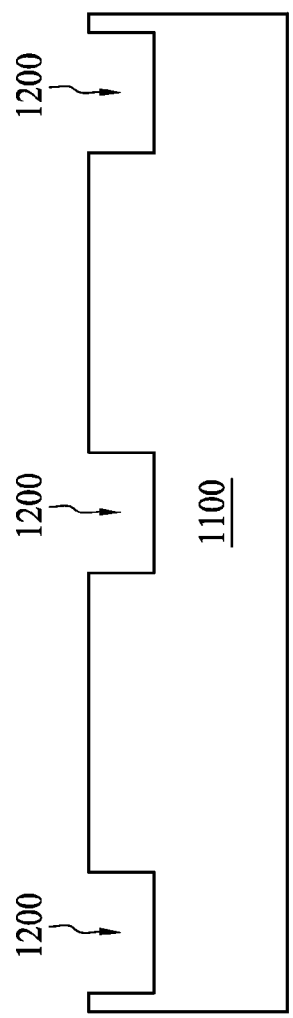
Figure 11E:
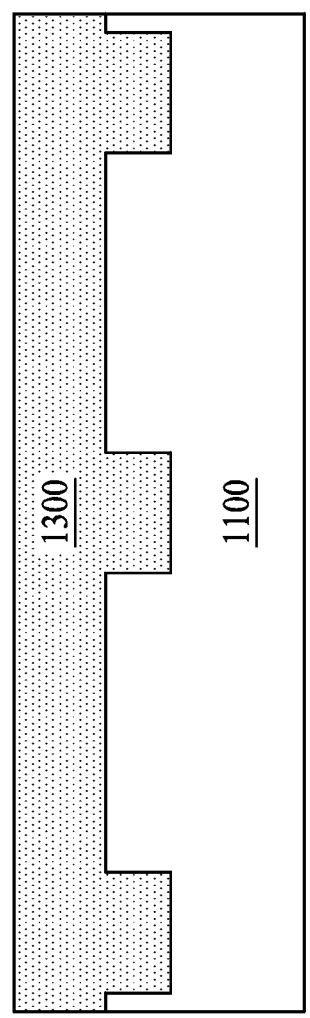
Figure 11F:
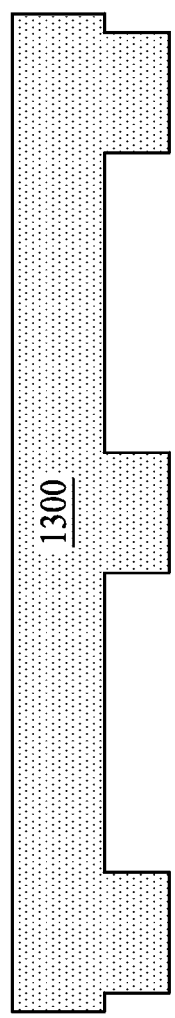

FIG. 11A to FIG. 11F show cross sectional views of fragmental operations for manufacturing the transfer means as previously discussed. In some embodiments, the transfer means is a transfer stamp made of elastomeric materials. In FIG. 11A, a molding substrate 1100, for example, a silicon wafer, is provided. In FIG. 11B, a masking layer 1100R such as a hard mask or a photoresist layer is formed over a surface of the masking layer 1100R. In FIG. 11C, the masking layer 1100R is patterned to obtain a patterned masking layer 1100R'. For example, when the masking layer 1100R is made of photoresist materials, electron beam lithography or photolithography can be utilized to form the patterned masking layer 1100R'. In FIG. 11D, patterns of the patterned masking layer 1100R' is transferred to the molding substrate 1100, forming several recesses 1200 at the positions not covered by the patterned masking layer 1100R'. In some embodiments, the pattern transfer operation can be an ICP-RIE operation. In FIG. 11E, elastomeric material is spin coated over the molding substrate 1100, filling the recesses 1200 at the surface of the molding substrate 1100. The elastomeric material layer 1300 is subsequently cured to reach suitable elastic property. In some embodiments, the elastomeric material layer 1300 can be polydimethylsiloxane (PDMS). In FIG. 11F, the molding substrate 1100 is separated from the elastomeric material layer 1300, and the elastomeric transfer stamp is obtained.

Figure 12B:
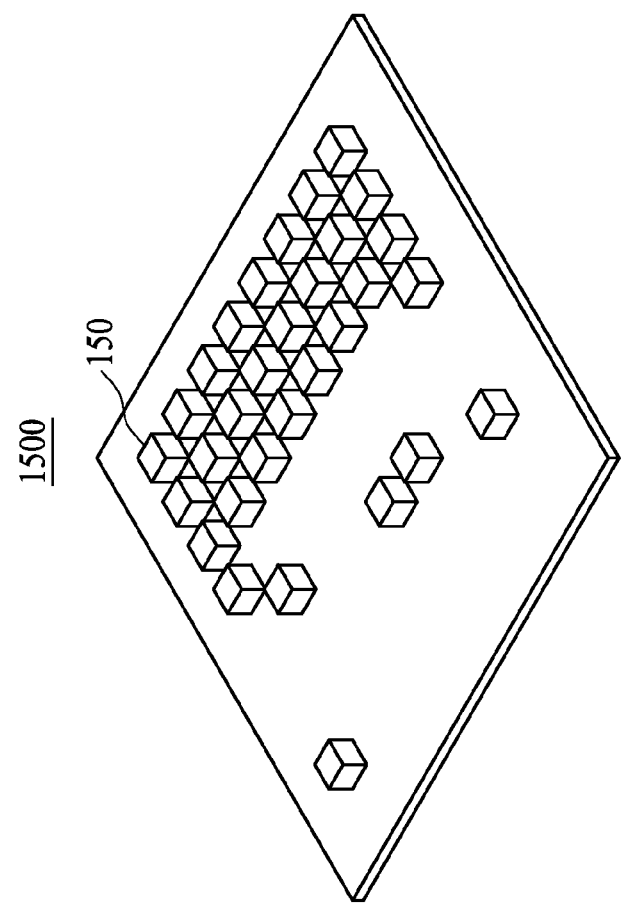
FIG. 12B shows a perspective view of the programmed transfer stamp of FIG. 12A.
Figure 12A:
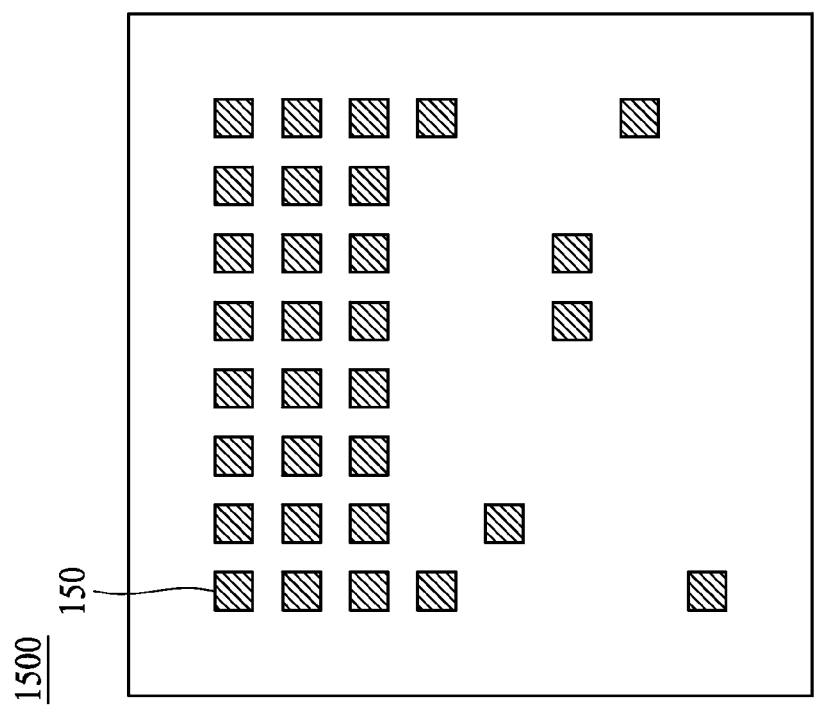
FIG. 12A shows a bottom view of a programmed transfer stamp, in accordance with some embodiments of the present disclosure.

FIG. 12A is a bottom view (viewing from a side where the protrusions reside) of an elastomeric transfer stamp 1500 prepared according to the manufacturing method discussed previously. A plurality of protrusions 150 are designed to be formed as recesses on the molding substrate (not shown in FIG. 12A), and subsequently become protrusions of the transfer stamp 1500. The arrangement of the protrusions is designed according to the following semiconductor structure transfer requirements. FIG. 12B is a perspective view of the elastomeric transfer stamp 1500 as in FIG. 12A. A height H of the protrusion 150 is also a design factor.

FIG. 13A is a bottom view (viewing from a side where the protrusions reside) of an elastomeric transfer stamp 1600 prepared according to the manufacturing method discussed previously. As previously discussed, a plurality of protrusions 160A, 160B, 160C, and 160D are formed on the transfer stamp 1600. Compared to the protrusions 150 in FIG. 12A and FIG. 12B, the protrusions 160A, 160B, 160C, and 160D can have different shapes and sizes. For example, the protrusions 160A and 160B are both square shape but with different dimensions. The protrusion 160C is a rectangular shape, and the protrusion 160D is a circular shape. FIG. 13B is a perspective view of the elastomeric transfer stamp 1600 as in FIG. 13A. The arrangement of the protrusions is designed according to the following semiconductor structure transfer requirements. For example, protrusion 160A may be designed to pick up a bigger semiconductor structure while protrusion 160B may pick up a smaller semiconductor structure from a temporary substrate.

Figure 14:
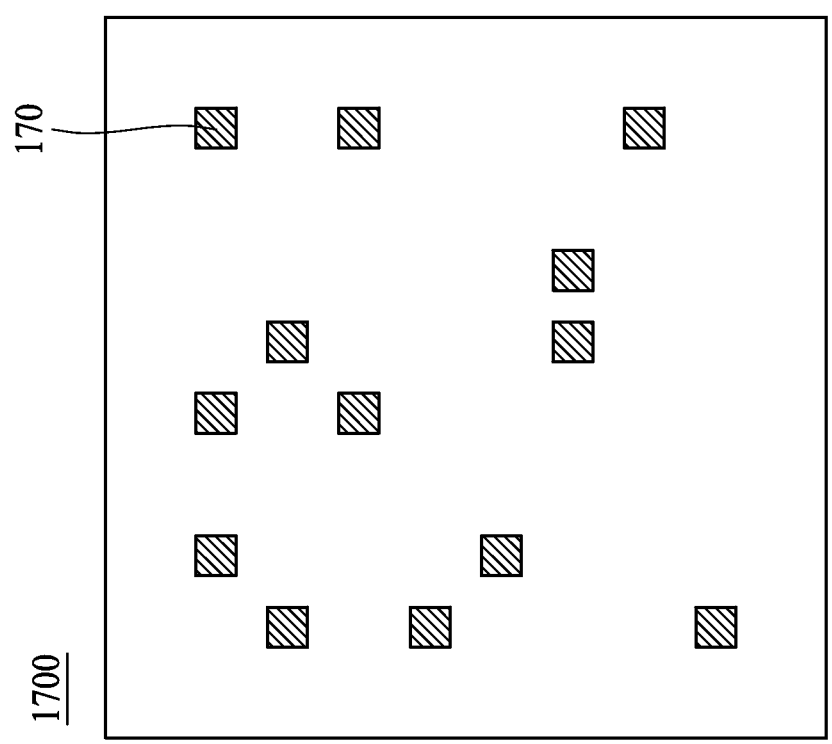
FIG. 14 shows a bottom view of a programmed transfer stamp, in accordance with some embodiments of the present disclosure.
Figure 15:
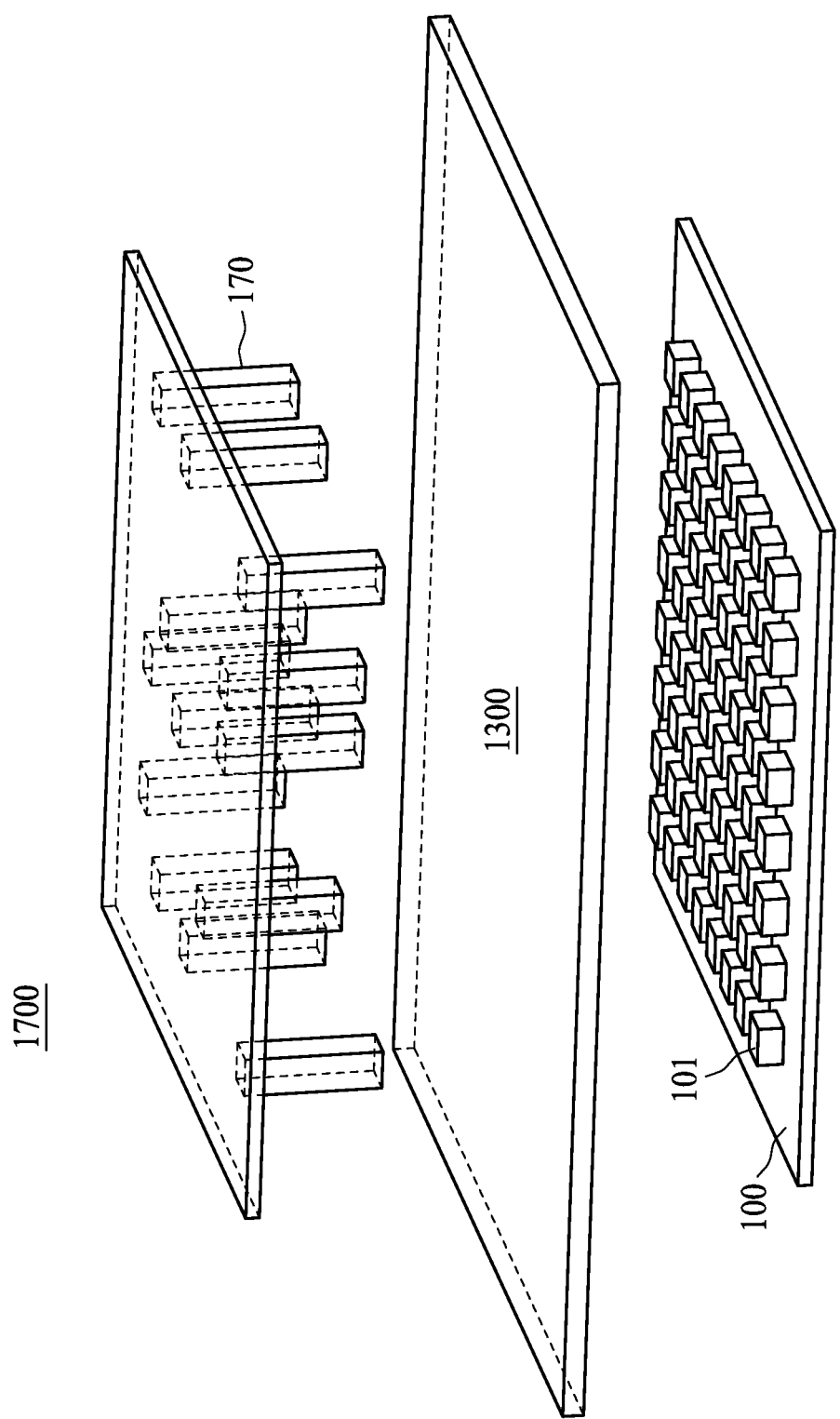
FIG. 15 shows a perspective view of the transfer stamp of FIG. 14, an elastomeric film, and an array of semiconductor structures on a temporary substrate, in accordance with some embodiments of the present disclosure.

FIG. 14 is a bottom view (viewing from a side where the protrusions reside) of a transfer molding 1700. The transfer molding 1700 includes a plurality of protrusions 170 arranged in a predetermined fashion. FIG. 15 shows a perspective view of the transfer molding 1700 of FIG. 14, an elastomeric film 1300, and an array of semiconductor structures 101 on a temporary substrate 100. In some embodiments, the transfer molding 1700 is pressed against the elastomeric film 1300 held between the transfer molding 1700 and the semiconductor structures 101. The protrusion arrangement on the transfer molding 1700 is transferred onto the elastomeric film 1300, forming a plurality of protrusion (not shown in FIG. 15). Subsequently, the transfer molding 1700 and the elastomeric film 1300 are descended toward the temporary substrate 100 to pick the semiconductor structure 101 positioned at the corresponding positions of the protrusions 170. In some embodiments, the transfer molding 1700 includes material rigid enough to elastically deform the elastomeric film.

Figures 16A, 16B:
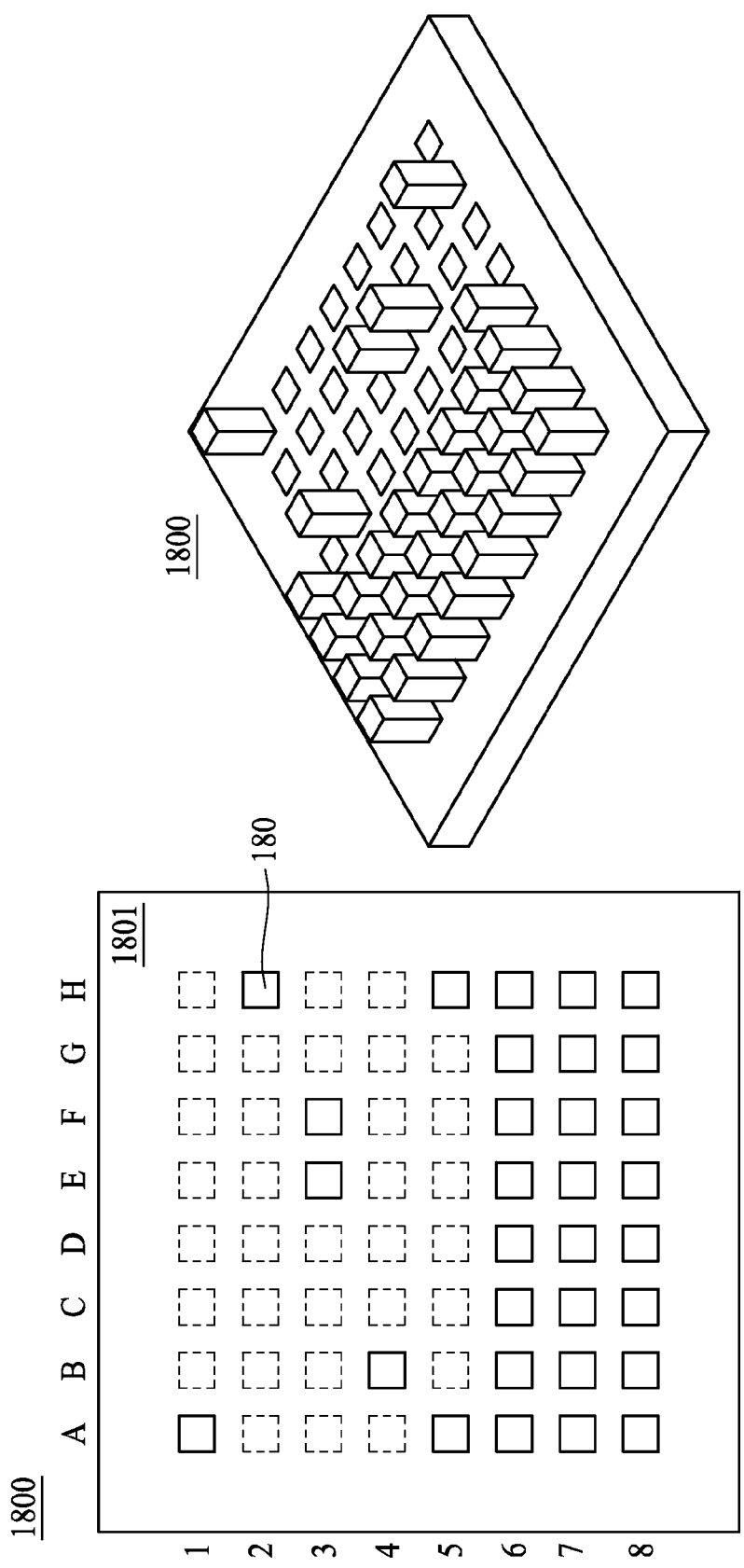
FIG. 16A shows a bottom view of a programmed transfer stamp modulator, in accordance with some embodiments of the present disclosure.
FIG. 16B shows a perspective view of the programmed transfer stamp modulator of FIG. 16A.

FIG. 16A is a bottom view (viewing from a side where the protrusions reside) of a transfer stamp modulator 1800. The transfer stamp modulator 1800 includes a plurality of individually-controlled bumps 180A that can be either protruding out from a bump housing 1801 (such as the bump at position A1, illustrated in solid lines) or stored in the bump housing 1801 (such as the bump at position B1, illustrated in dotted lines). The control of the individual bump can be done by a computer-based controlling system. FIG. 16B is a perspective view of the transfer stamp modulator 1800 in FIG. 16A.

Referring to FIGS. 15, 16A, and 16B, in some embodiments, the transfer stamp modulator 1800 can replace the transfer stamp 1700 in FIG. 15. The transfer stamp modulator 1800 is programmed to have a predetermined arrangement of the bumps 180, and is pressed against the elastomeric film 1300 held between the transfer stamp modulator 1800 and the semiconductor structures 101. For example in FIG. 16A, only bumps A1, H2, E3, F3, B4, A5, H5, A6 to H6, A7 to H7, A8 to H8 are programmed to protrude from the bump housing 1801. The bump arrangement on the semiconductor structures 101 is transferred onto the elastomeric film 1300, forming a plurality of protrusions. Subsequently, the transfer stamp modulator 1800 and the elastomeric film 1300 are descended toward the temporary substrate 100 to pick the semiconductor structure 101 positioned at the corresponding positions of the bumps 180. After a transfer cycle, that is, picking and placing specific semiconductor structures 101, the transfer stamp modulator 1800 can change the bump arrangement instantaneously by the computer-based controlling system. A new transfer cycle commences with a different protrusion patterns. Compared to the transfer stamps 1500, 1600, 1700 shown in FIG. 12A to FIG. 14, the transfer stamp modulator 1800 disclosed in some embodiments is more material and cost-effective.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device array, comprising:
    providing a temporary substrate;
    forming a plurality of discrete semiconductor structures over the temporary substrate;
    removing a surface portion of the temporary substrate to expose a peripheral bottom surface of the discrete semiconductor structure, wherein the removing the surface portion of the temporary substrate comprises removing the top portion of the temporary substrate until a point contact is formed on the temporary substrate connecting to the overlaying discrete semiconductor structure;
    detaching the discrete semiconductor structure from the temporary substrate with a transfer stamp having protrusions by a parallel transfer operation in which several of the plurality of the discrete semiconductor structures are transferred synchronically, wherein positions of the protrusions of the stamper are programmed by a transfer stamp modulator having a plurality of individually-controlled bumps; and
    synchronically disposing the several of the plurality of the discrete semiconductor structures on predetermined positions of a target substrate.

2. The method of claim 1, wherein the temporary substrate comprises non-crystalline materials.

3. The method of claim 1, wherein the temporary substrate comprises organic material.

4. The method of claim 1, wherein the temporary substrate comprises gallium oxide.

5. The method of claim 1, wherein the temporary substrate comprises silicon.

6. The method of claim 1, wherein the temporary substrate comprises gallium arsenide.

7. The method of claim 1, wherein the forming of the plurality of discrete semiconductor structures comprises forming a light emitting diode (LED), a laser structure, a solar cell, or a microelectronic chip.

8. The method of claim 1, wherein the forming of the plurality of discrete semiconductor structures comprises forming an organic device.

9. The method of claim 1, wherein the forming of the plurality of discrete semiconductor structures comprises forming an amorphous device.

10. The method of claim 1, wherein the forming of the plurality of discrete semiconductor structures comprises forming a polycrystalline device.

11. The method of claim 1, wherein the removing the surface portion of the temporary substrate comprises applying chemical etching agent in an etching operation.

12. The method of claim 11, wherein the chemical etching agent comprises acidic solution, basic solution, organic solution, or combinations thereof.

13. The method of claim 1, wherein the point contact is a top surface of a cone or a multifaceted pyramid.

14. The method of claim 1, wherein the detaching the discrete semiconductor structure from the temporary substrate comprises:
    descending the transfer stamp having the protrusions until the protrusions being in contact with a top surface of the discrete semiconductor structure; and
    elevating the transfer stamp.

15. The method of claim 1, wherein the disposing the several of the plurality of the discrete semiconductor structures comprises:
    descending the transfer stamp having the protrusions until the bottom surface of the discrete semiconductor structure being in contact with the target substrate; and
    elevating the transfer stamp.

16. The method of claim 14, wherein an arrangement of the protrusions of the transfer stamp are programmable.

17. A method for transferring discrete semiconductor device, comprising:
    detaching discrete semiconductor structures of a first type from a first temporary substrate supporting the discrete semiconductor structures of the first type by a transfer stamp using van der Waals interactions;
    carrying the discrete semiconductor structures over a target substrate by the transfer stamp; and
    dismounting the discrete semiconductor structures of the first type from the transfer stamp to predetermined sites on the target substrate,
    wherein the transfer stamp comprises a plurality of protrusions, positions of the plurality of protrusions being instantaneously modulated to match the predetermined sites on the target substrate.

18. The method of claim 17, further comprising:
    detaching discrete semiconductor structures of a second type from a second temporary substrate supporting the discrete semiconductor structures of the second type by the transfer stamp.

19. The method of claim 17, wherein the dismounting the discrete semiconductor structures of the first type comprises aligning the discrete semiconductor structures of the first type with an alignment mark on the target substrate.

20. The method of claim 18, wherein the discrete semiconductor structures of the first type is a blue LED, and the discrete semiconductor structures of the second type is a green LED.

21. The method of claim 18, wherein the discrete semiconductor structures of the first type is an optoelectronic device, and the discrete semiconductor structures of the second type is a microelectronic device.

\* \* \* \* \*